(12) United States Patent
Catalano et al.

(10) Patent No.: US 9,053,845 B2
(45) Date of Patent: Jun. 9, 2015

(54) TRANSFORMER WITH PLANAR PRIMARY WINDING

(71) Applicant: General Electric Company, Schenectady, NY (US)

(72) Inventors: Robert J. Catalano, Mesquite, TX (US); David Stevens, Sunnyvale, TX (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/839,778

(22) Filed: Mar. 15, 2013

(65) Prior Publication Data

US 2013/0328655 A1  Dec. 12, 2013

Related U.S. Application Data

(60) Provisional application No. 61/658,450, filed on Jun. 12, 2012.

(51) Int. Cl.

| H01F 5/00 | (2006.01) |
|---|---|
| H05K 3/30 | (2006.01) |
| H05K 1/16 | (2006.01) |
| H01F 27/28 | (2006.01) |
| H02M 1/32 | (2007.01) |
| H02M 1/36 | (2007.01) |
| H02M 1/00 | (2006.01) |

(52) U.S. Cl.
CPC .................. *H01F 5/003* (2013.01); *H05K 3/30* (2013.01); *Y10T 29/49144* (2015.01); *H01F 5/00* (2013.01); *H05K 1/165* (2013.01); *H05K 2201/086* (2013.01); *H05K 2201/09063* (2013.01); *H01F 27/2804* (2013.01); *H01F 2027/2814* (2013.01); *H02M 1/32* (2013.01); *H02M 1/36* (2013.01); *H02M 2001/0009* (2013.01)

(58) Field of Classification Search
CPC ........... H01F 5/00; H01F 27/02; H01F 27/24; H01F 27/28; H01F 27/29; H01F 27/30
USPC .......................................... 336/200, 232, 212
IPC .......................................................... H01F 5/00
See application file for complete search history.

(56) References Cited

U.S. PATENT DOCUMENTS

| 5,485,365 | A |  | 1/1996 | Dan-Harry |
|---|---|---|---|---|
| 6,154,376 | A |  | 11/2000 | Dan-Harry |
| 6,400,249 | B1 |  | 6/2002 | Jitaru |
| 6,529,389 | B2 |  | 3/2003 | Perlick et al. |
| 6,828,894 | B1 | * | 12/2004 | Sorger et al. .................. 336/200 |
| 6,867,678 | B2 | * | 3/2005 | Yang ............................. 336/200 |
| 7,295,448 | B2 |  | 11/2007 | Zhu |
| 7,332,993 | B1 |  | 2/2008 | Nussbaum |
| 7,417,875 | B2 |  | 8/2008 | Chandrasekaran et al. |
| 7,675,764 | B2 |  | 3/2010 | Chandrasekaran et al. |
| 2009/0040001 | A1 |  | 2/2009 | Young et al. |
| 2013/0229834 | A1 |  | 9/2013 | Garrity et al. |

* cited by examiner

*Primary Examiner* — Tuyen Nguyen
(74) *Attorney, Agent, or Firm* — General Electric Company

(57) ABSTRACT

A transformer, such as a current sense transformer, in which conductive traces disposed within a printed circuit board serve as the primary winding of the transformer. The transformer also includes a secondary winding, for example wound around a hollow pin of a bobbin, through which a leg of a magnetic core is disposed. The magnetic core leg, and in some embodiments also all or a part of the secondary winding, is inserted into a through-hole in the printed circuit board that is surrounded by the primary winding traces.

12 Claims, 12 Drawing Sheets

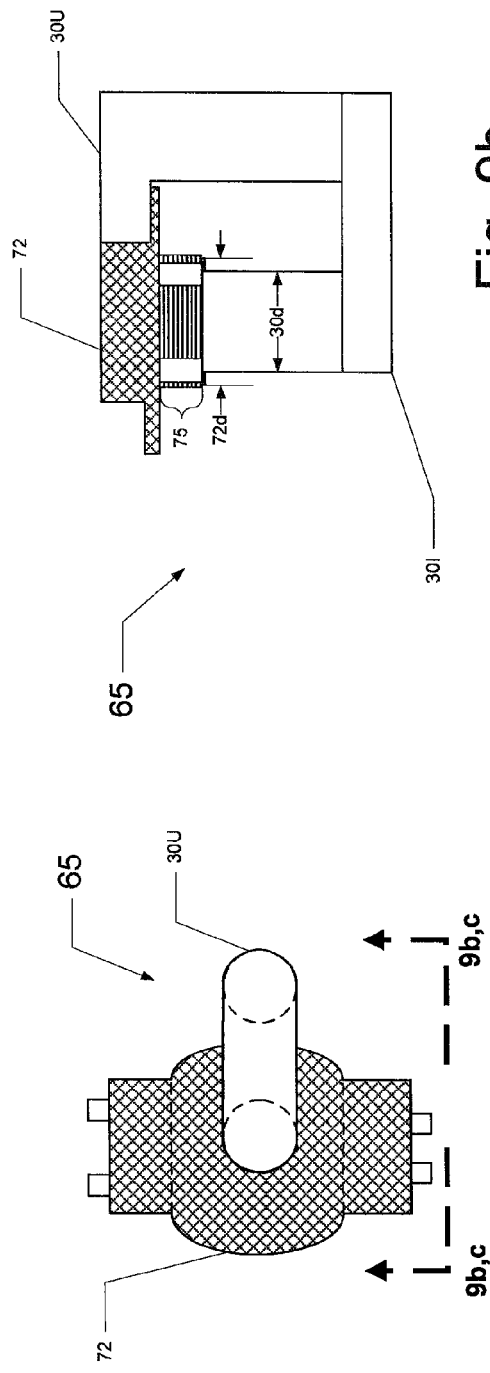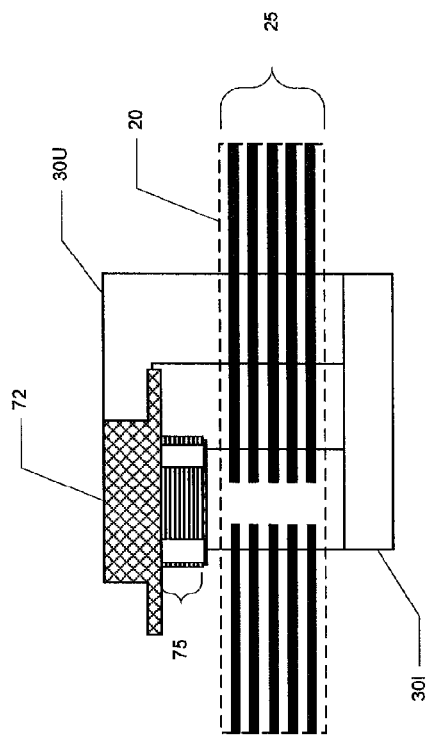

TRANSFORMER WITH PLANAR PRIMARY WINDING

CROSS-REFERENCE TO RELATED APPLICATIONS

This application claims priority, under 35 U.S.C. §119(e), to Provisional Application No. 61/658,450, filed Jun. 12, 2012, which is incorporated herein by this reference.

BACKGROUND

This disclosure is in the field of electrical transformers. Disclosed embodiments are directed to current sense transformers, other applications of transformers, and systems including such devices, for example power converters.

Electromagnetic transformers have long been staple components in many electrical and electronic systems, and provide such functions in those systems as galvanic isolation, step-down or step-up voltage or current conversion, and power conversion, among others. In addition to the use of transformers in the power loops of these systems, transformers are often used as current sensors in control applications.

As fundamental in the art, the miniaturization of electronic systems continues as a dominating trend. This drive toward miniaturization also applies to power electronics, including such sub-systems as power converters. But because transformers necessarily require a magnetic core and also multiple windings of wire or another conductor, transformers cannot be readily integrated into a solid-state component, and the extent to which discrete transformers can otherwise be miniaturized is also limited, especially relative to other components. The transformers may be the tallest component on its sub-system printed circuit board, and thus present the limiting dimension from the standpoint of sub-system form factor. Additional issues are addressed below.

BRIEF DESCRIPTION OF THE EMBODIMENTS

Disclosed embodiments provide a transformer and a method of making the same in which one or more conductors in the printed circuit board to which the transformer is mounted serve as one of the windings of the transformer.

Disclosed embodiments provide such a transformer and method in which the secondary winding is disposed in whole or in part within the plane of the printed circuit board.

Disclosed embodiments provide such a transformer and method in which the primary winding consists of multiple traces in respective layers of the printed circuit board, connected in parallel to reduce series resistance of the primary.

Disclosed embodiments provide such a transformer and method suitable for use as a current transformer.

A transformer including primary and secondary windings and a magnetic core is constructed using one or more printed circuit board traces as one of the windings (e.g., the primary). A magnetic core has a first leg inserted through a hole in the printed circuit board at a location near the primary winding conductor trances, and one or more other legs inserted through the board at nearby locations. A secondary winding is coaxial with the magnetic core, for example, wound about a hollow pin of a bobbin through which the magnetic core is disposed.

BRIEF DESCRIPTION OF THE EXEMPLARY DRAWINGS

FIGS. 9a through 9c are plan and elevation views of a current sense transformer according to the embodiment of FIG. 8.

DETAILED DESCRIPTION OF THE EMBODIMENTS

Figure 1A:
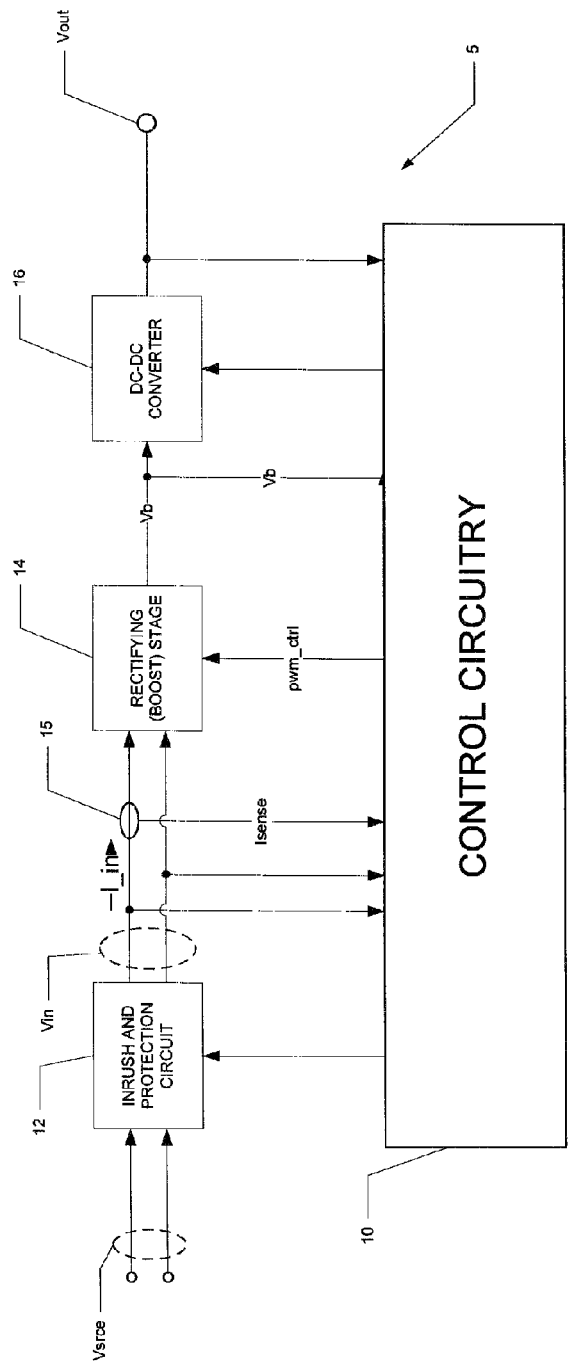
FIG. 1a is an electrical diagram, in block form, illustrating a power converter including a current sense transformer according to disclosed embodiments.

FIG. 1a is an electrical diagram, in block form, of a power converter including a current sense transformer constructed according to embodiments of the disclosure. In this example, power converter 5 has input terminals Vsrce that receive power from a power source (not shown), such as a solar cell array, a wind-powered generator, the AC grid, a fuel cell or battery, or the like. The input power applied to terminals Vsrce is received by inrush and protection circuit 12, which is constructed in the conventional manner to suppress and reduce electromagnetic interference (EMI), power surges and inrushes, and the like; in addition, protection circuit 12 may include relays or other circuit interrupters useful in safely shutting down power converter 5 (i.e., disconnecting it from the power source) in the event of an electrical fault.

In this example, power converter 5 is a two-stage converter, including a first stage of rectifying stage 14 followed by a secondary stage of isolating DC-DC converter stage 16. Input power Vin, in the same general form as the power received across terminals Vsrce, is presented by inrush and protection circuit 12 to rectifying stage 14. Rectifying stage 14 is constructed in the conventional manner, for example including a diode bridge operating as a half-wave rectifier, and that is connected to a switching cell including a switching transistor and a flyback diode; a series-connected inductor and a capacitor in parallel with the output will typically be included to provide power factor compensation in the conventional manner. Rectifying stage 14 produces a DC voltage at DC bus Vb based on input power Vin, whether AC or DC. In some embodiments, the voltage generated at DC bus Vb is higher than the voltage of the power received at terminal Vsrce, for example on the order of 380 to 400 Vdc. In that case, rectifying stage 14 may be referred to as a "boost" stage.

In this two-stage example of power converter 5, DC-DC converter stage 16 converts the DC bus voltage Vb from rectifying stage 14 into the eventual output DC voltage presented to a load via output bus Vout. Typically, DC-DC converter stage 16 galvanically isolates output terminal Vout from DC bus Vb within power converter 5, and thus from the power source to which power converter 5 is connected, to prevent propagation of faults. DC-DC converter stage 16 may be of conventional construction in this embodiment, for example as an LLC resonant DC-DC converter including an inverting substage followed by a rectifying substage.

Control of the operation of rectifying stage 14 and DC-DC converter 16, and possibly also control of inrush and protection circuit 12, is effected by control circuitry 10 in power converter 5 of this embodiment of the invention. For example, control circuitry 10 controls the power factor compensation applied by rectifying stage 14 by generating a pulse-width modulated signal on lines pwm_ctrl that gates one or more switching transistor or transistors in rectifying stage 14. Alternatively, control circuitry 10 may control rectifying stage 14 according to a Maximum Power Point Tracking (MPPT) approach, particularly if the input power source is a renewable (solar, wind, etc.) energy source. Control circuitry 10 also includes the functionality for controlling the operation of DC-DC converter stage 16, for example by way of feedback control to regulate the output voltage appearing at terminal Vout, or by operating DC-DC converter 16 in an "open loop" manner by gating one or more switching transistors to operate at the resonant frequency of DC-DC converter 16.

In this embodiment of the invention, control circuitry 10 controls power converter 5 in response to voltage and current levels sensed at nodes along the power path of power converter 5. In the example of FIG. 1a, various voltages (e.g., voltage Vin at the output of inrush and protection circuit 12, voltage Vb at the output of rectifying stage 14, and voltage Vout at the output of power converter 5) are directly sensed in the conventional manner. Also in this example of FIG. 1a, current sense transformer 15 senses input current I_in at the output of inrush and protection circuit 12 and applied to the input of rectifying stage 14, and communicates a corresponding sense current Isense to control circuitry 10, for example to control the power factor compensation in rectifying stage 14.

Figure 1B:
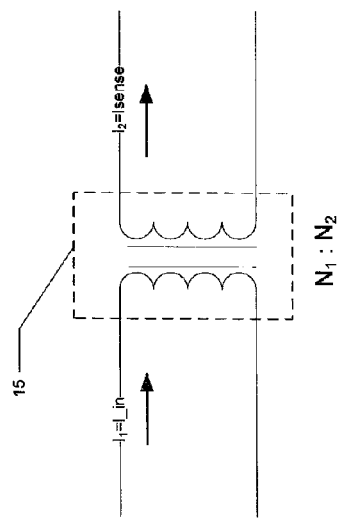
FIG. 1b is an electrical diagram, in schematic form, of a current sense transformer according to disclosed embodiments.

As mentioned above, one important application of transformer 15 is as a current sense transformer, such as used in power converter 5 to sense current I_in. FIG. 1b schematically illustrates transformer 15 serving this function in power converter 5 of FIG. 1a. In this example, transformer 15 is a magnetic core transformer with its primary winding of $N_1$ turns receiving primary current $i_1$ (i.e. sensed input current I_in) which will induce a secondary current $i_2$ (i.e., sense current Isense) in its secondary winding of $N_2$ turns. In circuits such as power converter 5, input current I_in may be a relatively large current (on the order of amperes), but sense current Isense need (and ought) only be a very small current to accomplish its sensing function. As known in the art, a current sense transformer is typically implemented by a primary winding of a small number of turns (typically a single term), and a secondary winding having a larger number of turns (e.g., 100 times the number of turns in the primary). In this example, transformer 15 is thus constructed to have a relatively large turns ratio $N_2:N_1$, so that a small current $i_2$=Isense will be induced in the secondary winding that is reflective of the larger current $i_1$=I_in conducted by the primary winding, according to:

$$i_2 = i_1 \frac{N_1}{N_2}$$

assuming adequate coupling between the primary and secondary windings of transformer 15. The induced current $i_2$ can thus be made much smaller than the primary current $i_1$ being measured, by constructing transformer 15 with a correspondingly ratio of secondary turns $N_2$ to primary turns $N_1$, as will be described below.

This specification will describe various embodiments of current sense transformer 15, as useful for sensing currents such as current I_in at the output of rectifying stage 14 in power converter 5. However, it is contemplated that the construction of these embodiments is applicable to a wide range of transformers, including not only current sense transformers, but also step-up and step-down voltage transformers, transformers implemented for purposes of galvanic isolation, and the like. As such, it is to be understood that the application of current sense transformer 15 in power converter 5 as shown in FIG. 1a is described by way of example only, and is not intended to limit the scope of the claims.

It has been observed that transformers in general, even relatively small-sized transformers such as current sense transformers, are physically large devices as compared with modern packaged integrated circuits and discrete electronic components. This large size is the necessary result of the electromagnetic nature of conventional transformers, requiring such sub-components as wire windings, a ferrite or other magnetic core, and the like. These physical limitations inhibit the ability of transformers to be miniaturized at the same rate as the solid-state components of power converters, switching power supplies, and other electronic subsystems. As a result, the physical size of conventional discrete transformers can, in some respects, become a limiting physical dimension. For example, in the implementation of an electronic system on a printed circuit board, even relatively small transformers such as current sense transformers may have the tallest profile among the various components on that printed circuit board. In that case, it is the height of these transformers that may define the spacing between adjacent circuit boards in an enclosure, in some cases defining the minimum size of the enclosure itself.

Figure 2:
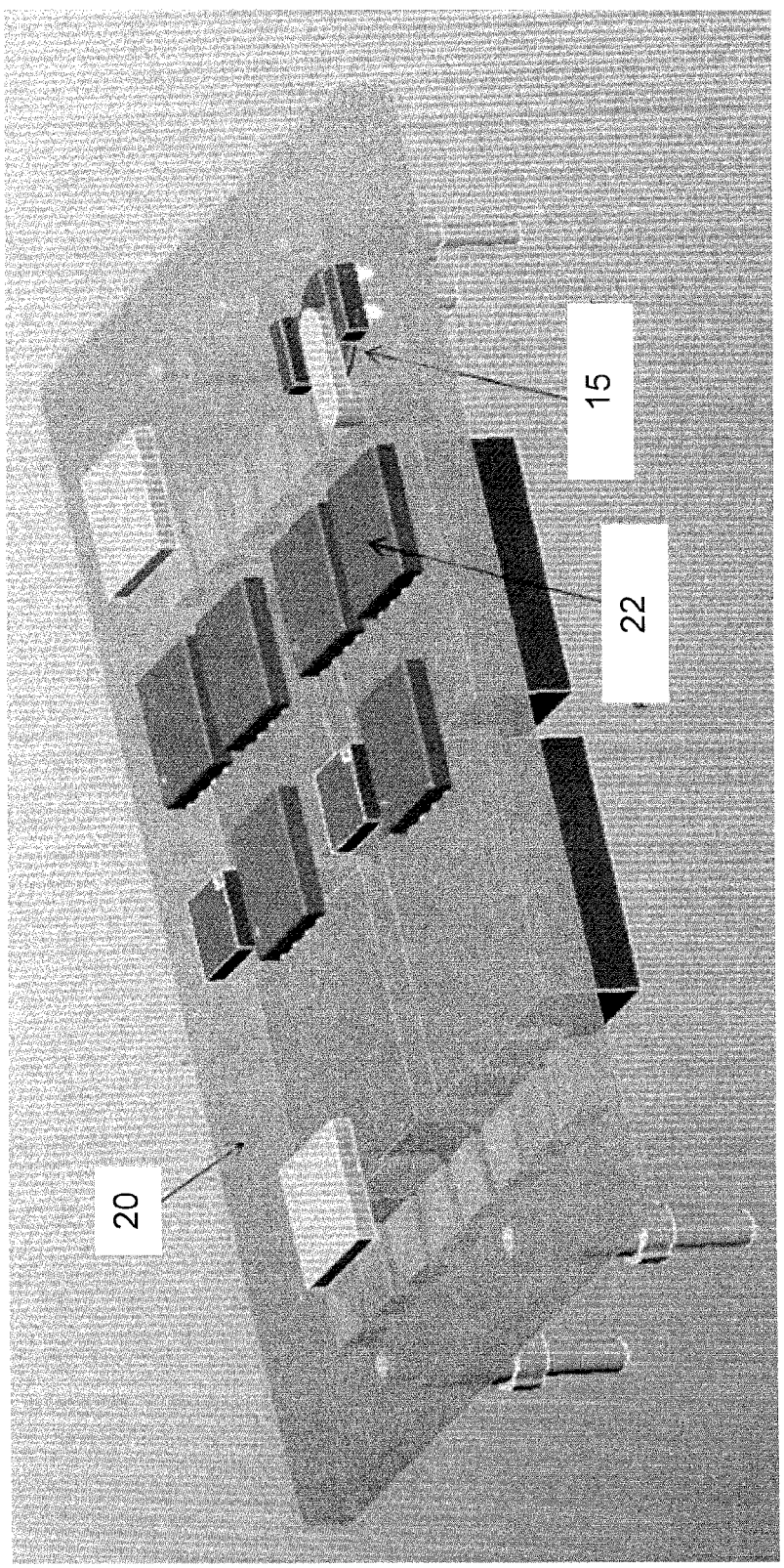
FIG. 2 is a perspective and transparent view of a printed circuit board implementation of a subsystem including a current sense transformer according to an embodiment.

FIG. 2 illustrates printed circuit board 20 implementing an electronic subsystem, such as a switching power supply including power converter 5, according to embodiments disclosed in this specification. In this example, printed circuit board 20 includes various packaged and discrete electronic components, including power magnetic, switching devices, control circuitry, and the like, along with the appropriate connectors (not shown) by way of which the subsystem interfaces with a rack or larger system. Current sense transformer 15 according to an embodiment is shown as implemented on the top surface of printed circuit board 20. As will be described in further detail below, transformer 15 is constructed according to the embodiments disclosed herein to provide an efficient low profile, facilitating miniaturization of the subsystem and system into which it is implemented. As evident from FIG. 2, the height of transformer 15 is on the same order as the height of other components on printed circuit board 20, including packaged solid-state component 22 (which is representative of the other components mounted on the top surface of printed circuit board 20).

Figure 3:
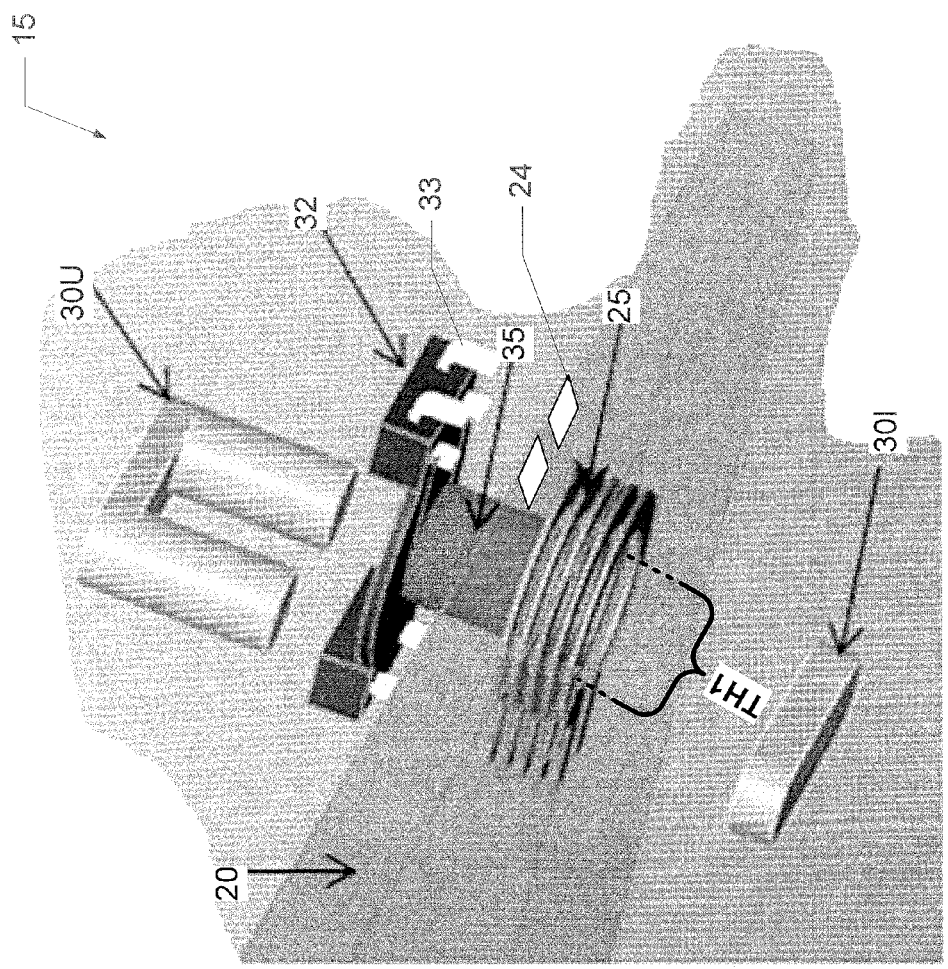
FIG. 3 is a perspective exploded view of a current sense transformer according to an embodiment.

FIG. 3 is an exploded perspective view illustrating the construction of transformer 15 according to an embodiment, with this view shown in combination with a portion of multilayer printed circuit board 20 (shown semi-transparently) at which transformer 15 is being mounted. Indeed, as will become apparent from this description, one of the components of transformer 15 is realized by planar conductive traces 25 within printed circuit board 20. In the example of FIG. 3 and as will be described in further detail below, conductive traces 25 are planar in the sense that each trace 25 is individually realized in a separate layer of printed circuit board 20, nearly encircling through-hole TH1 in printed circuit board 20.

Referring back to FIG. 3, conductive traces 25 may provide multiple turns in the primary winding if connected in series with one another (five turns in this example), or may constitute a single turn winding if connected in parallel with one another. For the case of transformer 15 serving as a current sense transformer, parallel connection of traces 25 will both facilitate a small sense current in the secondary winding, and also minimize DC resistance in its primary winding, reducing circuit loading and loss.

According to this embodiment, secondary winding 35 is constructed as a large number of turns (e.g., on the order of fifty to one hundred turns) of one or more wires wrapped around a hollow pin of bobbin 32, and terminating at respective surface-mount leads 33 supported by bobbin 32. In the alternative to that shown in FIG. 3, a flange may be present at the end of the pin of bobbin 32 to facilitate proper placement of the wire constituting secondary winding 35; in this case, the outside diameter of this flange should be at most slightly larger than the resulting thickness of secondary winding 35, to ensure that the size of the hole in printed circuit board 20 (and thus the routing of conductive traces 35 around that hole) is not unduly enlarged. An additional insulating material (not shown), such as an insulating sleeve or one or more layers of tape, may be applied over the surface of secondary winding 35 as necessary or desirable for increasing the primary-to-secondary breakdown voltage.

Bobbin 32 may be constructed from molded plastic or other non-conductive and non-magnetic material. In this example, bobbin 32 provides structural support for surface-mount leads 33, which are connected to respective ends of secondary winding 35, and which are constructed in the conventional manner. In the example of FIG. 3, two secondary windings 35 may be supported by the two pair of surface-mount leads 33 as shown.

Alternatively, transformer 15 may be constructed as a "bobbin-less" transformer. As known in the art, bobbin-less construction relies on an insulating material applied to wires wrapped around a mold, following by curing or other solidification of the material and removal of the mold. The solidified insulating material is of sufficient strength to maintain the shape and integrity of secondary winding 35, with a lead frame or similar structure supporting surface-mount leads 33 to which the terminal ends of the wire of secondary winding 35 are connected.

Referring to FIG. 3 again, transformer 15 includes a two-piece magnetic core, consisting of U-core 30U and I-core 30I. U-core 30U is a "U" shaped ferrite element, in the sense that it includes two legs extending from a base plate; I-core 30I is a plate, also of ferrite, of the appropriate size and shape to attach to ends of the two legs of U-core 30U, as will be evident from the following description. In the alternative to ferrite, U-core 30U and I-core 30I may be constructed of other magnetic materials, as may depend on the desired coupling between the primary and secondary of transformer 15 for its circuit application. Upon assembly, in the view of FIG. 3, U-core 30U will be placed at the top surface of printed circuit board 20 (i.e., on the same side as bobbin 32), with one of its legs extending through through-hole TH1 and its other leg extending through another through-hole (not shown) in printed circuit board 20. I-core 30I will be adhered to the ends of those legs, at or near the bottom surface of printed circuit board 20. The combination of U-core 30U and I-core 30I will provide a magnetic circuit, by way of which a magnetic field generated by the primary winding of conductive traces 25 is coupled to secondary winding 35, both of which are concentric with one of the legs of U-core 30U.

Figure 4B:
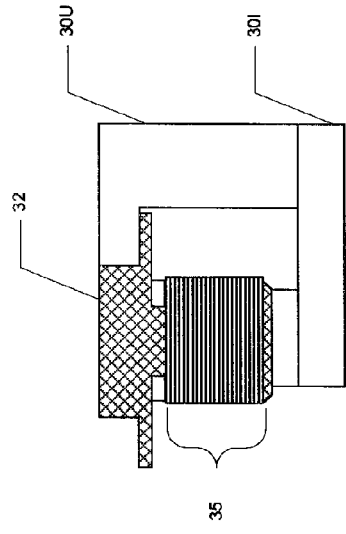
FIGS. 4a through 4e are plan, elevation, and cross-sectional views of a current sense transformer according to the embodiment of FIG. 3.
Figure 4A:
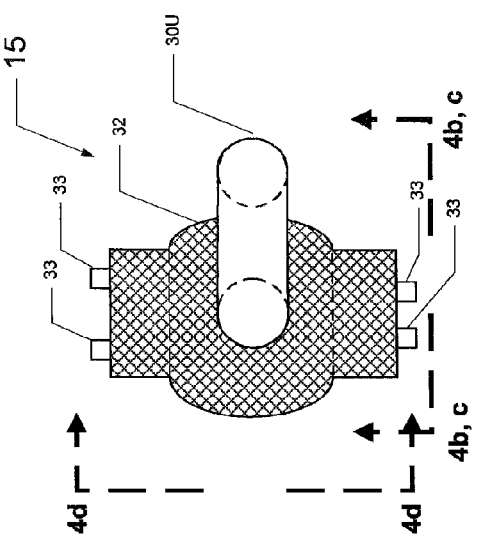

FIGS. 4a through 4e illustrate the construction of transformer 15 when assembled, according to this embodiment. FIG. 4a illustrates transformer 15 in plan view, looking top-down (i.e., from the bobbin side). In this view, the locations of the two legs of U-core 30U are shown in shadow. FIG. 4b shows transformer 15 after its assembly, in an elevation view (and without printed circuit board 20). As evident form FIG. 4b, upon assembly of transformer 15, one leg of U-core 30U will pass within the hollow pin portion of bobbin 32, concentrically with secondary winding 35, with its terminal end in contact with and adhered to I-core 30I. The other leg of U-core 30U passes around bobbin 32 as shown, with its terminal end also in contact with and adhered to I-core 30I.

Figure 4D:
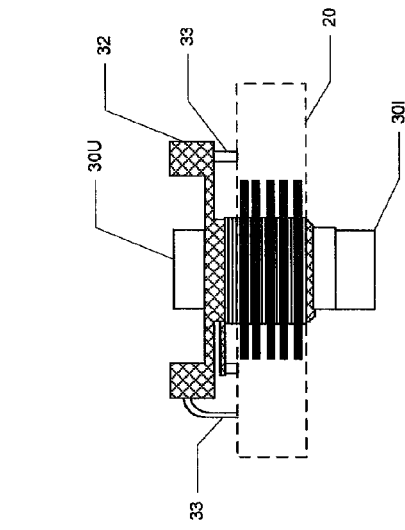
Figure 4C:
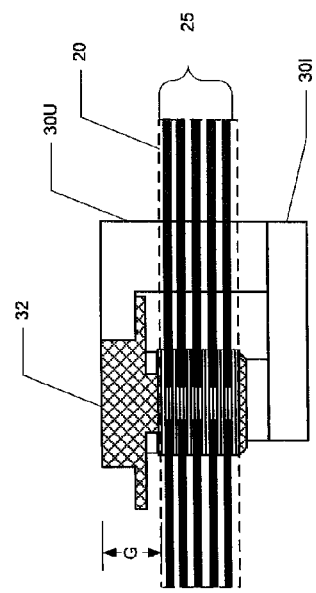

FIG. 4c illustrates transformer 15 in the same elevation view as FIG. 4b, showing its relative position to printed circuit board 20 and conductive traces 25 when installed. FIG. 4d is a similar view, taken in a different direction. As evident from FIGS. 4c and 4d, most if not all of secondary winding 35 is disposed within the plane of printed circuit board 20, as is the primary winding made up of planar conductive traces 25. Surface-mount leads 33 can readily contact corresponding surface-mount lands 24 on the top surface of printed circuit board 20, as evident in FIG. 4d, facilitating solder attachment thereto.

Figure 4E:
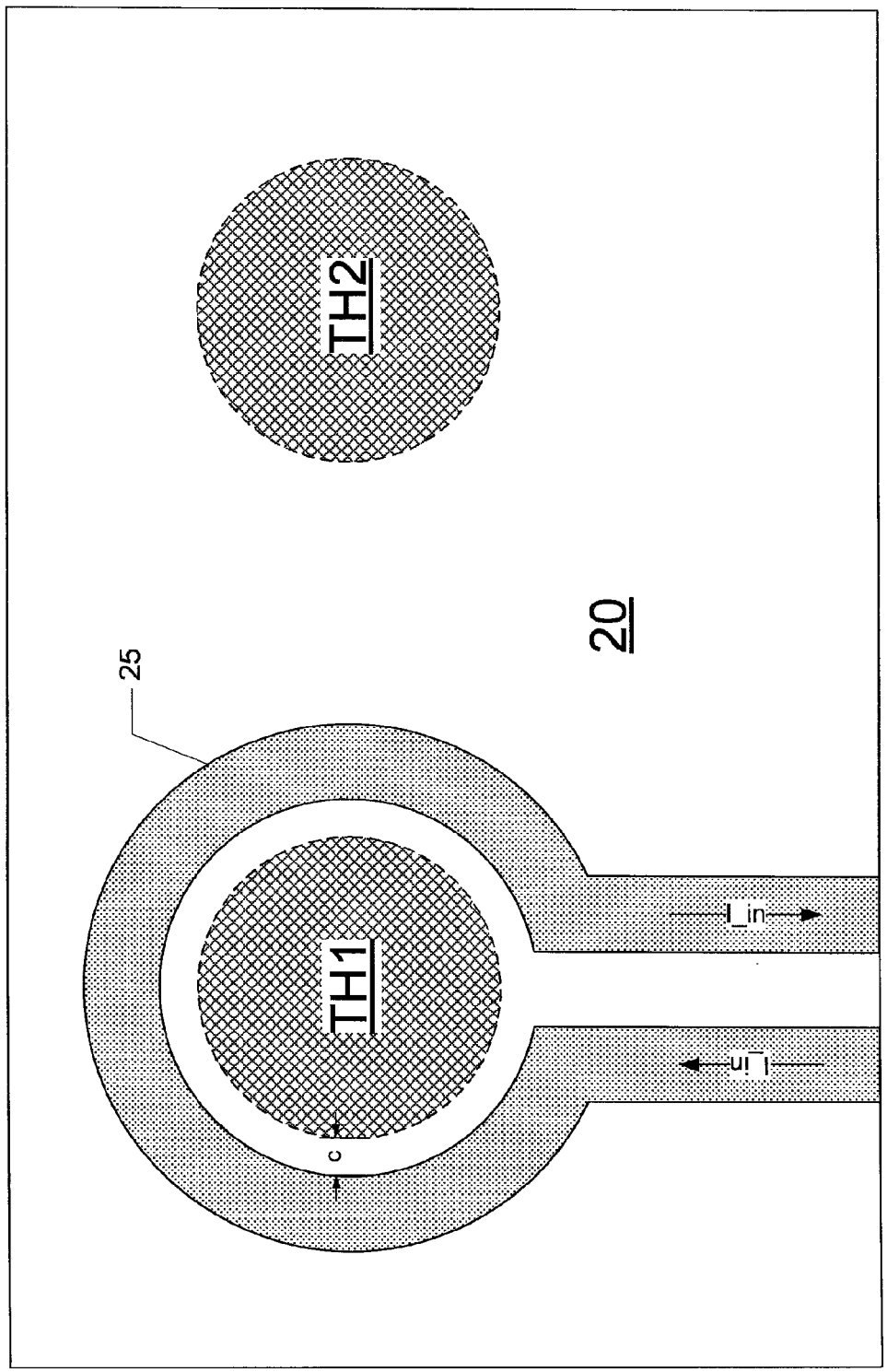

FIG. 4e illustrates one of planar conductive traces 25 in the primary winding of transformer 15, taken as a cross-sectional plan view within one of the levels of printed circuit board 20. As shown in FIG. 4e, conductive trace 25 is routed around through-hole TH1 in printed circuit board 20, and as such will carry sensed current I_in around through-hole TH1, thus encircling a leg of U-core 30I when assembled. The inner edge of trace 25 is separated from the edge of through-hole TH1 by a distance C, which provides the insulative (i.e., creepage) distance required for galvanic isolation, and too attain the desired primary-to-secondary breakdown voltage specification for transformer 15. This creepage distance C can be quite small in this embodiment, as the material of printed circuit board 20 between trace 25 and through-hole TH1 (i.e., within distance C) is a highly insulative material such as a resin impregnated B-stage cloth ("pre-preg") or the like, as known in the art. A second through-hole TH2 is disposed through printed circuit board 20 near through-hole TH1, and will accommodate the second leg of U-core-30U in this example.

According to this embodiment and as shown in FIG. 3c, the overall height G of transformer 15 above the top surface of printed circuit board 20 is relatively low, due to the primary and secondary windings being contained largely, if not entirely, within the thickness of printed circuit board 20. The actual height G of bobbin 32 and U-core 30U above the top surface of printed circuit board 20 (and the extent to which U-core 30U and I-core 30I project below the bottom surface) will depend upon the thicknesses of bobbin 32 and cores 30U, 30I necessary for the desired structural strength, and other factors.

Figure 5:
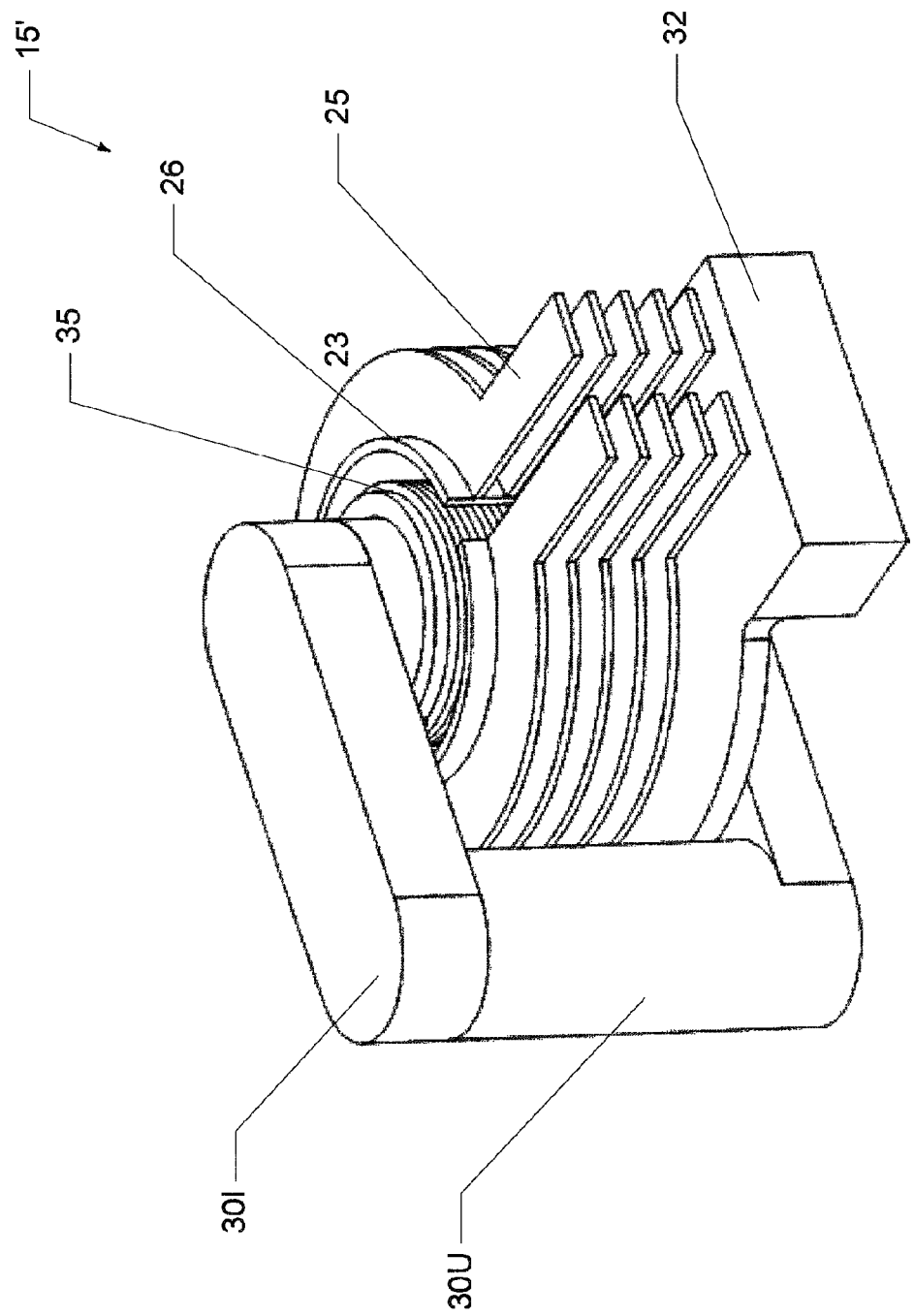
FIG. 5 is a perspective view of a current sense transformer according to an embodiment, as installed into a printed circuit board according to an embodiment.

FIG. 5 shows transformer 15' according to a variation of the above-described embodiment, in which edge plating of printed circuit board 20 provides the parallel connection of conductive traces 25 in the primary winding. The view of FIG. 5 is from the underside of printed circuit board 20, relative to that shown in FIG. 3. As shown in FIG. 5, plating 26 at the edge of through-hole TH1 through printed circuit board 20 provides an additional point of connection of conductive traces 25 in parallel with one another, further reducing the series DC resistance of the primary winding of transformer 15'. Notch or slot 23 in edge plating 26 (and, perhaps, in the printed circuit board 20 itself) is provided so that the turn of traces 25 encircling the leg of U-core 30I is not shorted out; such a notch 23 may be constructed in the routing of printed circuit board 20 by the board manufacturer, if convenient. In this variation of the embodiment, because the inner surface of through-hole TH1 is conductive by edge plating 26, secondary winding 35 may require additional insulation (e.g., tape, silicone, etc.) on its wires to meet the desired primary-to-secondary breakdown voltage specification.

Another contemplated variation of this embodiment is the construction of its primary winding as conductive traces on the top surface, bottom surface, or both of the printed circuit board, either in addition to or instead of conductive traces in the interior of the board as described above. If surface traces are incorporated into the primary winding, additional creepage distance or additional insulation between the primary and secondary windings may be required to ensure proper breakdown performance and galvanic isolation. In addition, this variation may also affect the placement of other components in the subsystem.

Figure 6:
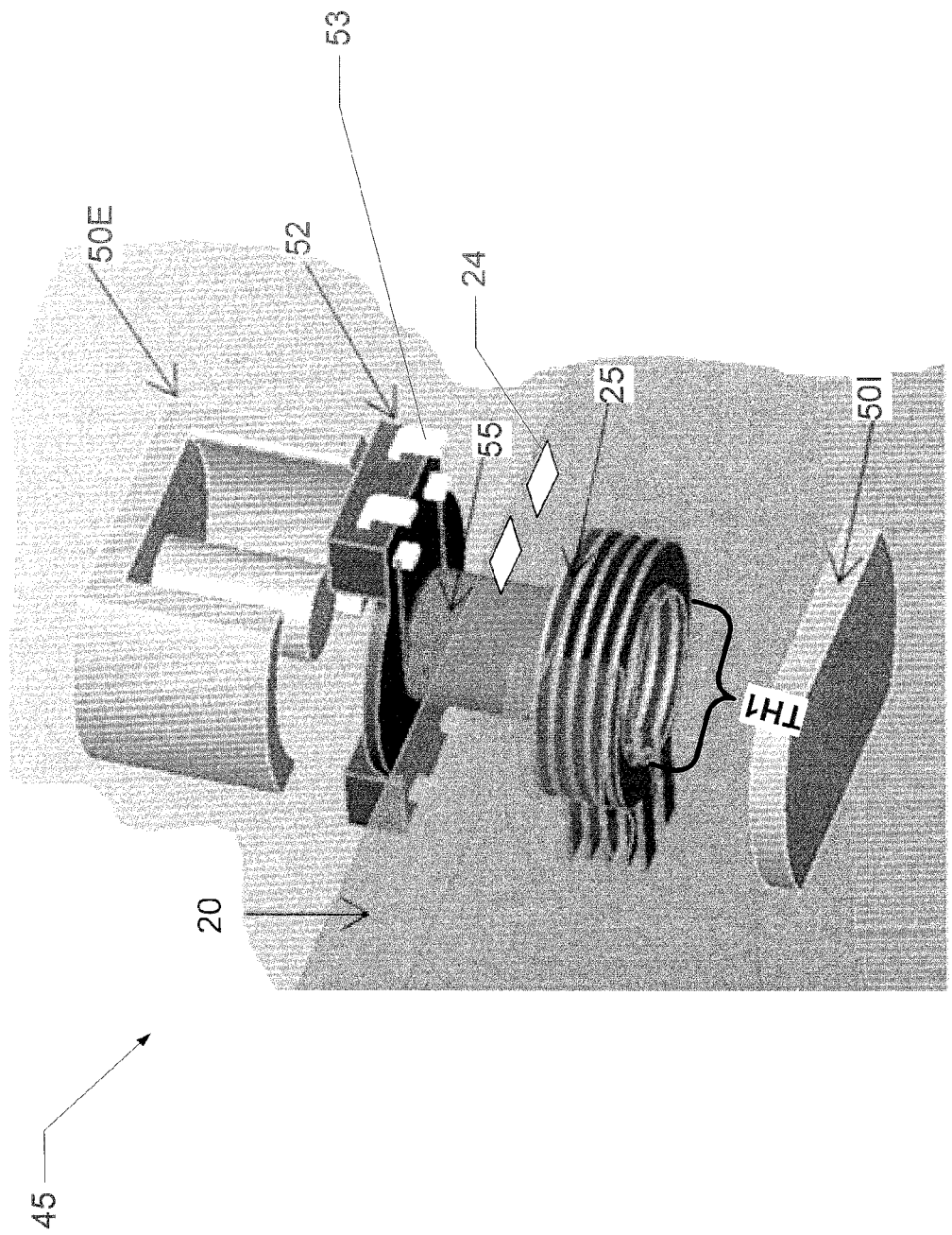
FIG. 6 is a perspective exploded view of a current sense transformer according to another embodiment.

FIG. 6 is an exploded perspective view of transformer 45 according to another embodiment. Transformer 45 may be constructed and implemented to serve as a current sense transformer in similar fashion as transformer 15 described above, or as another type of transformer such as a step-down or step-up transformer, and the like. Similar components in transformer 45 as in transformer 15 described above will be referred to by way of the same reference numerals, and will be constructed similarly as previously described.

In this embodiment, the magnetic core of transformer 45 is constructed as the combination of E-core 50E and I-core 50I. E-core 50E is constructed as an "E" shaped body of ferrite or another magnetic material, having a center cylindrical leg and opposing arc-shaped side legs on either side of the center leg, each extending from a base plate as shown. While the legs of E-core 50E are cylindrical in this embodiment, those legs may alternatively have a cross-section that is rectangular, square, or another shape, as desired. In this embodiment, as will be apparent from this description, all three of these legs will extend into and through corresponding through-holes in printed circuit board 20; I-core 50I will connect or adhere to the terminal end of each of those legs, completing the magnetic circuit. E-core 50E fits over bobbin 52, which has a hollow pin into which the center leg of E-core 50E fits, and which is shaped on opposing sides to match the inner surface of the arc-shaped opposing legs of E-core 50E. Secondary winding 55 is wrapped around the hollow pin of bobbin 52, and its ends terminate at surface-mount leads 52 supported by bobbin 52.

As described above in connection with transformer 15, the primary winding of transformer 45 is constructed from one or more conductive traces 25 disposed within printed circuit board 20. For the application of a current sense transformer, traces 25 are connected in parallel either at a location away from transformer 45 or by way of edge plating as described above in connection with FIG. 5. Printed circuit board 20 includes lands 24 to which leads 53 contact and will be connected.

Figure 7A:
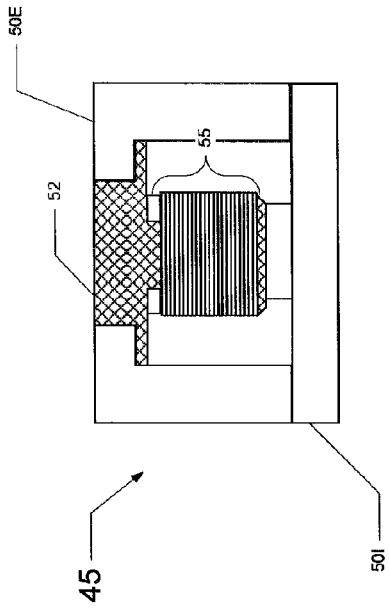
FIGS. 7a through 7d are plan and elevation views of a current sense transformer according to the embodiment of FIG. 6.
Figure 7B:
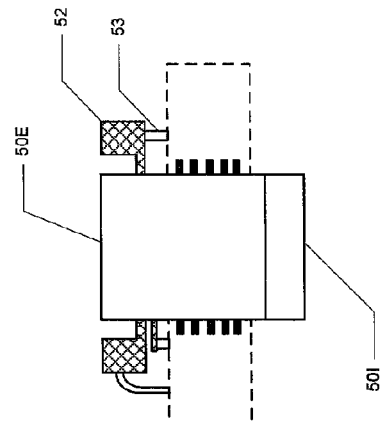
Figure 7C:
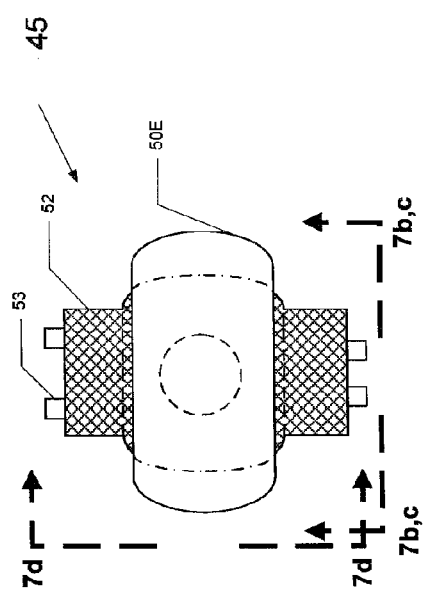
Figure 7D:
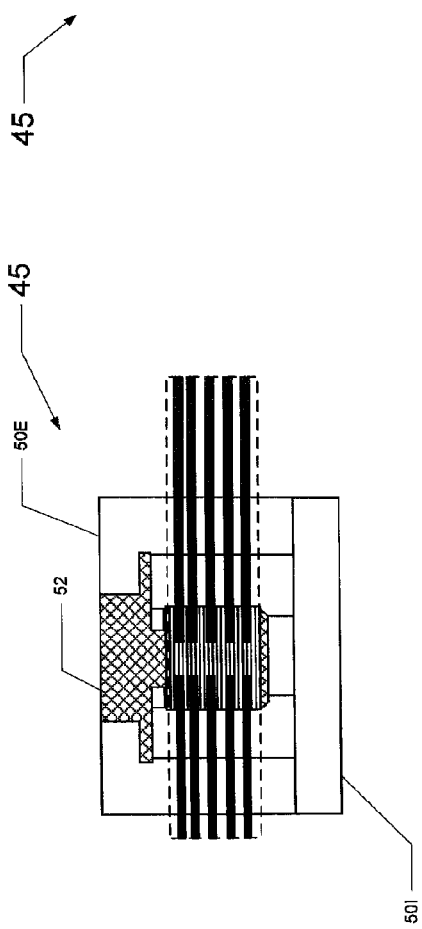

FIGS. 7a through 7d illustrate the construction of assembled transformer 45 in more detail, by way of plan and elevation views. In the top-down plan view of FIG. 7a, E-core 50E extends over the full width of bobbin 52; the location of the center and opposing side legs of E-core 50E are shown in shadow. As shown in the elevation view of FIGS. 7b and 7c, the center leg of E-core 50E passes through the hollow pin portion of bobbin 52, concentrically with secondary winding 55, and has its terminal end in contact with and adhered to I-core 50I. The arc-shaped side legs of E-core 50E pass on opposing sides of bobbin 52, and also have their terminal ends in contact with and adhered to I-core 50I. The relative location of printed circuit board 20 and conductive traces 25 to transformer 45 is shown in FIGS. 7c and 7d. As evident from FIGS. 7c and 7d, as in the case of transformer 15 described above, most if not all of secondary winding 55 is within the plane of printed circuit board 20, encircling the magnetic core of the center leg of E-core 50E, and surrounded by the primary winding of planar conductive traces 25.

This embodiment of transformer 45 as shown in FIGS. 6 and 7a through 7d may occupy additional board space when implemented at printed circuit board 20. However, it is contemplated that the two opposing legs of E-core 50E may provide additional stability to the structure of transformer 45 as it is placed on printed circuit board 20 and adhered to I-core 50I, as compared with transformer 15 described above. This improved stability may facilitate the reliable solder reflow attachment of leads 53 to lands 24. In addition, the opposing side legs of E-core 50E may improve the magnetic shielding of transformer 45, to the extent that magnetic leakage from the rest of the circuit may exist.

Figure 8:
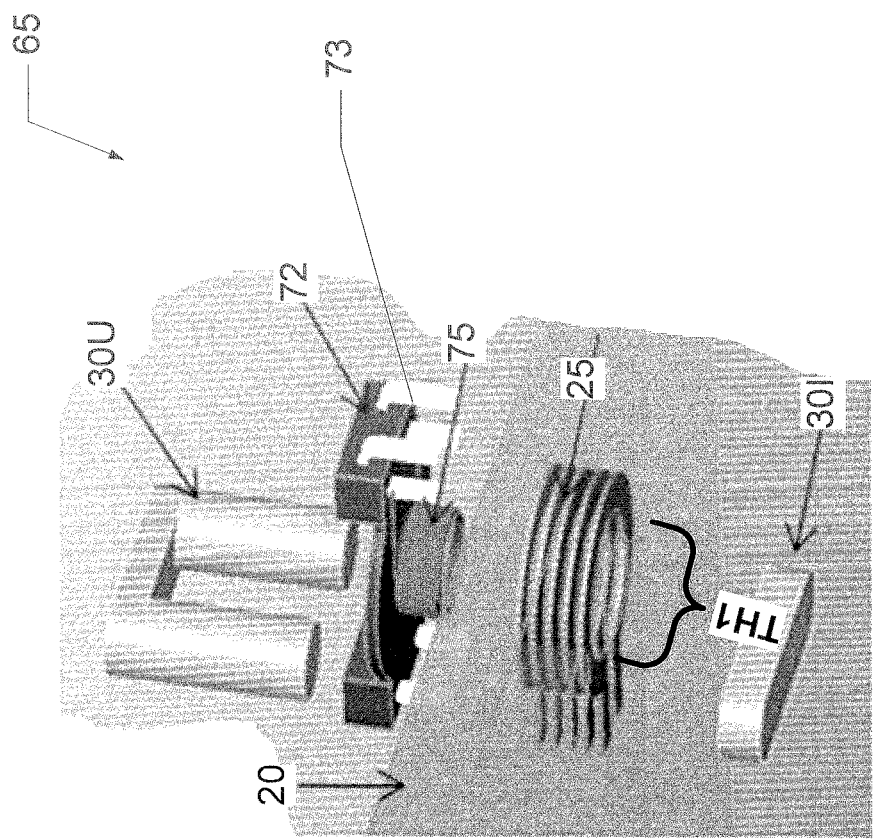
FIG. 8 is a perspective exploded view of a current sense transformer according to another embodiment.

FIG. 8 is an exploded perspective view of transformer 65 according to another embodiment, and FIGS. 9a through 9c are plan and elevation views of transformer 65 in its assembled form. Transformer 65 may be constructed and implemented to serve as a current sense transformer in similar fashion as transformer 15 described above, or as another type of transformer such as a step-down or step-up transformer, and the like. Similar components in transformer 65 as in transformer 15 described above will be referred to by way of the same reference numerals, and will be constructed similarly as previously described.

In this embodiment, similarly as transformer 15 described above in connection with FIGS. 3 and 4a through 4e, the magnetic core of transformer 65 is constructed as the combination of U-core 30U and I-core 30I, formed of ferrite or another magnetic material. U-core 30U has two legs of cylindrical cross-section extending from a base plate, as described above. As mentioned above, while the legs of U-core 30E are cylindrical in this embodiment, those legs may alternatively have a cross-section that is rectangular, square, or another shape, as desired. In any case, these legs of U-core 30U will extend into and through corresponding through-holes in printed circuit board 20, and their terminal ends will attach to I-core 30I as described above, completing the magnetic circuit.

In this embodiment, U-core 30U fits over bobbin 72. Bobbin 72 is constructed of a plastic or other non-magnetic material, as in the embodiments described above, and has a hollow pin through which one leg of U-core 30U will be inserted. In this example, however, this hollow pin of bobbin 72 has a larger diameter than that of the leg of U-core 30U. FIG. 9b illustrates this relationship, in which the diameter of the hollow pin of bobbin 72 is indicated by the dimension 72d, and in which the diameter of the leg of U-core 30U is indicated by the smaller dimension 30d. Also in this embodiment, this diameter 72d will be larger than through-hole TH1 in printed circuit board 20; through-hole TH1 will be large enough to accept the cylindrical leg of U-core 30U, but not the larger hollow pin of bobbin 72.

Secondary winding 75 is wrapped around the hollow pin of bobbin 72, with its ends terminated at surface-mount leads 73 supported by bobbin 72, similarly as described above. But in this embodiment, the larger diameter of the pin of bobbin 72 causes secondary winding 75 to remain outside of the plane of printed circuit board 20 (FIG. 9c), instead residing above that plane. For example, upon assembly of transformer 65, this larger pin of bobbin 72 may rest on the top surface of printed circuit board 20; an optional flange may be provided to seat bobbin 72 on printed circuit board 20 if desired. Depending on the tolerable height above the top surface of printed circuit board 20, the number of turns in secondary winding 75 may be less than that in transformers 15, 45 due to the shorter bobbin pin around which secondary winding 75 is wound. Upon assembly of transformer 65 into the subsystem, as shown in FIG. 9c, the leg of U-core 30U extends through bobbin 72 and through through-hole TH1 in printed circuit board 20, concentrically with secondary winding 75 (and also within the primary winding of conductive traces 25).

This embodiment of transformer 65 may be advantageous in some implementations in which the area occupied by conductor routing of printed circuit board 20 is of critical importance. Because only the leg of U-core 30U, and not bobbin 72, passes into and through through-hole TH1 of printed circuit board 20, through-hole TH1 can be made smaller that if the bobbin pin were also to pass through. This, in turn, reduces the area occupied by conductive traces 25 (as to as shown in FIGS. 6 and 7a through 7d may occupy additional board space when implemented at printed circuit board 20, and thus the footprint of transformer 65 to the extent concerning conductor routing. Conversely, conductive traces 25 may be wider in this embodiment, because of the reduced diameter of through-hole TH1, reducing series resistance in the primary power path of the subsystem. While the placement of secondary winding 75 above the plane of printed circuit board 20 may reduce the primary-to-secondary coupling of transformer 65 as compared with other embodiments described above, this coupling degradation may not be important in many applications, such as current sense transformers.

Figure 10:
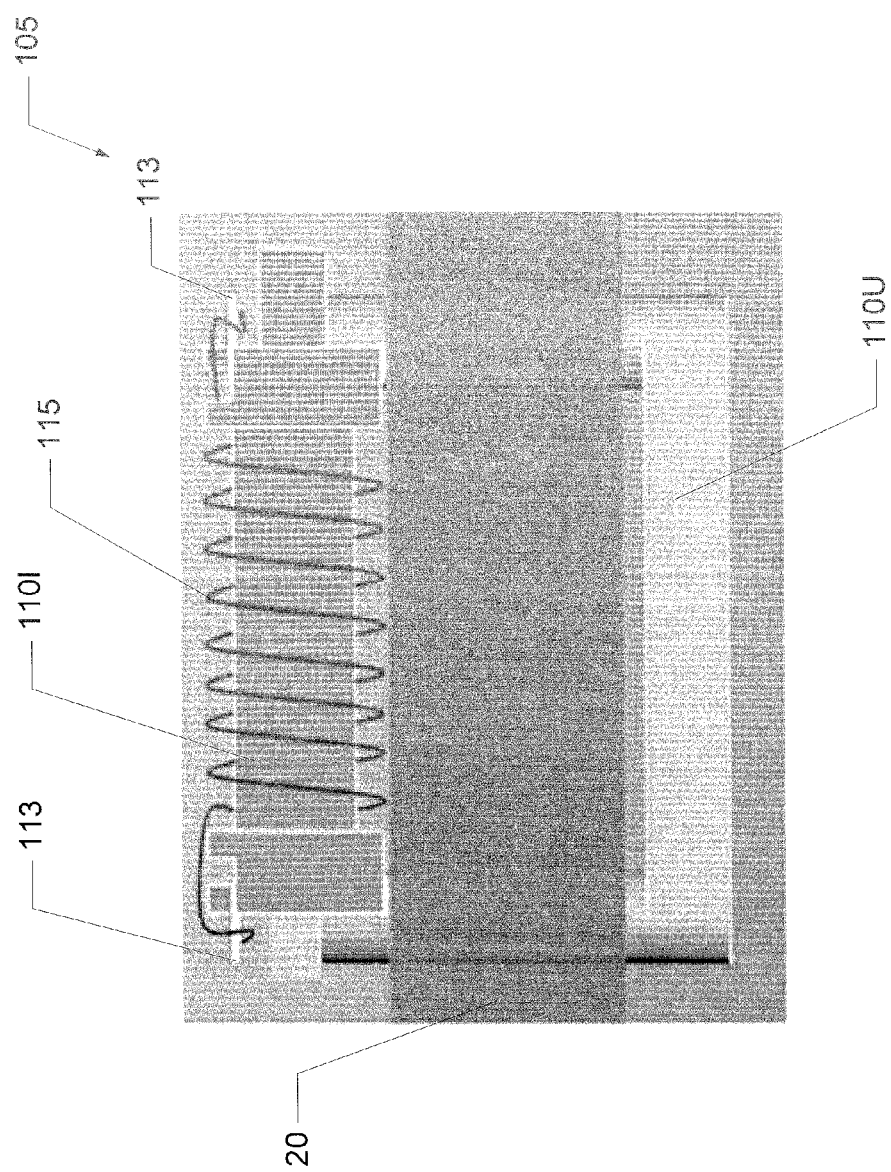
FIG. 10 is a plan view of a current sense transformer according to another embodiment.

FIG. 10 illustrates transformer 105 according to another embodiment. In this embodiment, transformer 105 includes U-core 110U of ferrite or another magnetic material, and having legs extending through through-holes in printed circuit board 20, as before. Printed circuit board includes conductive traces (not shown) encircling one or both of the legs of U-core 110U in the manner described above. In this embodiment, I-core 110I is constructed of ferrite or another magnetic material, and is attached to the terminal ends of the legs of U-core 110U on one side of printed circuit board 20. In this embodiment, I-core 110I is of cylindrical cross-sectional shape, but may alternatively have a rectangular, square, triangular, or other cross-sectional shape as desired. Also in this embodiment, secondary winding 115 is constructed as number of turns of wire around I-core 110I, and as such is entirely outside of the plane of printed circuit board 20. Secondary winding 115 is attached, at its terminal ends, to leads 113 extending from I-core 110I.

According to this embodiment, coupling between the primary winding of conductive traces within printed circuit board 20 and secondary winding 115 is made via the magnetic circuit of U-core 110U and I-core 110I. This construction of transformer 105, with secondary winding 115 disposed outside of the plane of printed circuit board 20, allows the through-holes in printed circuit board 20 to be smaller than in embodiments in which secondary winding 115 is disposed within that plane. In addition, transformer 105 does not require a bobbin to support secondary winding 115; rather, I-core 110I serves this function.

Figure 11:
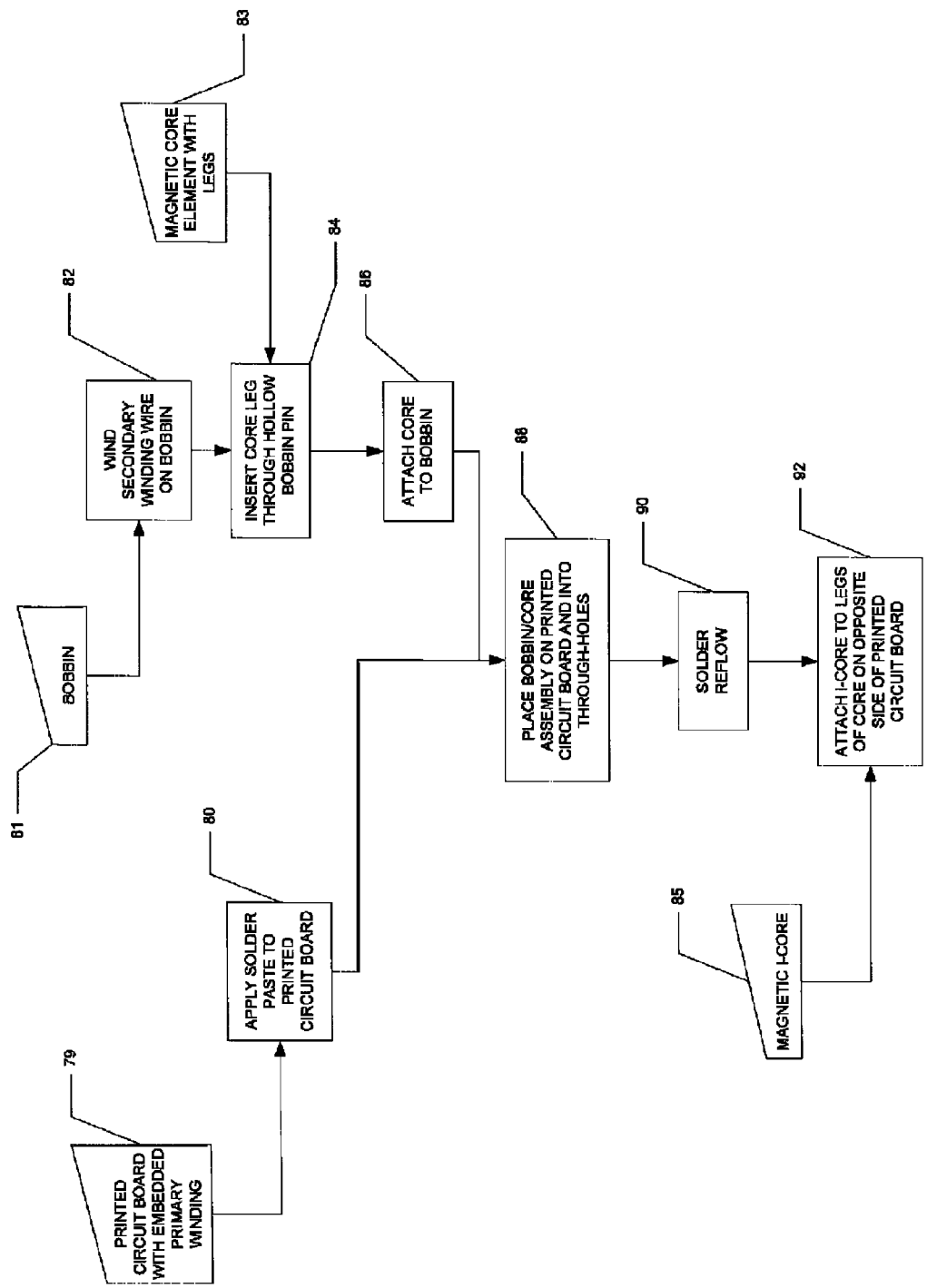
FIG. 11 is a flow diagram illustrating a method of fabricating a current sense transformer according to an embodiment.

FIG. 11 is a flow diagram illustrating the manufacture of a current sense transformer according to an embodiment, with reference to transformer 15 by way of example; of course, this manufacturing process flow may be used in connection with any of the above-described embodiments, incorporating any necessary or useful variations to that process flow to accommodate those particular constructions.

Construction of transformer 15 requires the obtaining of printed circuit board 20 including one or more conductive traces 25 that will constitute the primary winding of transformer 15 (in procurement process 79), those traces 25 deployed in corresponding levels of multi-level printed circuit board 20, or alternative as top or bottom surface traces, as desired. In process 80, solder paste is applied to printed circuit board 20 in the conventional manner for solder reflow assembly of components, including at lands 24 to which leads 33 of transformer 15 are to be soldered.

Independently from the construction of printed circuit board 20, bobbin 32 of the desired shape and with surface-mount leads 33 is manufactured or otherwise procured (procurement process 81), as is U-core 30U (procurement process 83), or such other core shape (e.g., E-core 50E) that includes two or more legs, as described above. In process 82, secondary winding 35 is formed by the winding of the desired number of turns $N_2$ of wire around the hollow pin of bobbin 32; also in process 82, terminal ends of the wire of secondary winding 35 are soldered or otherwise connected to the surface-mount leads on bobbin 32. Insulating tape, an insulating sleeve, or another insulating material may be applied externally to secondary winding 35 after its formation, if desired for structural protection or to provide additional electrical insulation. In process 84, one of the legs of U-core 30U is inserted through the hollow pin of bobbin 32. And in process 86, U-core 30U is attached to bobbin 32, aligned with one another in the desired orientation; an adhesive may be used to secure U-core 30U to bobbin 32.

In process 88, the assembly of bobbin 32 and U-core 30U is placed at the desired location of printed circuit board 20, with surface-mount leads 33 at corresponding lands 24 of printed circuit board 20, and with the legs of U-core 30U inserted into and through corresponding through-holes of printed circuit board 20. For the example of transformer 15, the hollow pin of bobbin 32 through which one leg of U-core 30U extends is also inserted into one of the through-holes (i.e., through-hole TH1). Alternatively, as in the case of transformer 65 described above (FIGS. 8 and 9a through 9c), the hollow pin of bobbin 72 around which secondary winding 75 is wrapped will be placed above and coaxial with through-hole TH1, through which the corresponding leg of U-core 30U extends. The placement of this assembly in process 88 may be carried out by a conventional pick-and-place machine as part of the overall placement of other components on printed circuit board 20; alternatively, placement process 88 may be performed manually. Reflow process 90 is then performed to reflow the solder of the solder paste applied in process 80, securing leads 33 of bobbin 32 to corresponding lands 24 on the surface of printed circuit board 20. The magnetic core of transformer 15 is then completed by I-core 30I. In process 92, I-core 30I is attached to the terminal ends of the legs of U-core 30U, for example by way of a glue or other adhesive, completing the manufacture and assembly of transformer 15 according to this embodiment.

Various alternatives to the manufacturing process flow of FIG. 11 are contemplated in connection with corresponding embodiments. One such alternative is that bobbin 32 may be placed into the appropriate location of printed circuit board 20 (process 88) and soldered into place on printed circuit board 20 (process 90) prior to the insertion and attachment of U-core 30E. In this alternative, processes 84 and 86 of FIG. 11 would follow solder reflow process 90.

According to another alternative, transformer 15 may be constructed in a "bobbin-less" fashion. In this case, as mentioned above, wire winding process 82 would be performed relative to a dummy bobbin structure serving in the role of a mold, after which an insulating structural material would be placed around secondary winding 35 and cured. The dummy bobbin is then removed, and secondary winding 35 would be secured to a lead frame or other structure supporting surface-mount leads 33, to which terminal ends of secondary winding 35 would be soldered or otherwise attached. U-core 30U would then be inserted through the interior of secondary winding 35 (process 84), and attached thereto and to I-core 30I as appropriate for the bobbin-less structure.

According to another alternative, transformer 105 (FIG. 10) may be constructed by the winding of the secondary winding wire onto I-core 110I, rather than onto a bobbin. U-core 110U would be placed at printed circuit board 20, with its legs extending through the through-holes as before, at least one of those through-holes being encircled by conductive traces within printed circuit board 20 to constitute the primary winding. I-core 110I can then be attached to the terminal ends of the legs of U-core 110U, by way of a glue or other adhesive. Leads 113 can then be attached to the appropriate lands or other conductors at printed circuit board 20, completing its assembly.

As mentioned above, various embodiments are described above relative to the illustrative example of a current sense transformer application. However, it is contemplated that these embodiments are also advantageous when applied to other type of transformer structures and implementations. One such implementation would be as a "step-down" transformer, or a power or signal transformer for purposes of galvanic isolation. It may be useful in those alternative implementations to construct the transformer to maximize coupling between primary and secondary, for example according to the embodiments of FIGS. 3, 5, and 6 in which the secondary winding is inserted within the plane of the printed circuit board and thus within the volume surrounded by the primary winding. According to another alternative, the conductive traces in the printed circuit board could serve as the secondary winding of the transformer, in which a current is induced based on the current conducted by a primary winding surrounding the magnetic core leg and bobbin. In that example, because the number of turns of wire wound on the bobbin will generally be larger than the number of conductive traces in the printed circuit board (even if connected in series with one another rather than in parallel), this variation would be useful in connection with a "step-up" transformer. Other alternatives may include an air gap within the magnetic core within primary and secondary windings; in this case, the improved shielding provided by the E-core construction described above relative to FIGS. 6 and 7a through 7d may be especially desirable.

These described embodiments may provide one or more important advantages over conventional printed circuit board-mounted transformers. One such advantage is the electrical isolation of the primary winding of the conductive board traces provided by the printed circuit board material, which also allows relatively close physical spacing between the primary and secondary windings without vulnerability to breakdown. Interconnect resistance in the primary loop is effectively zero because the primary winding can be realized by the printed circuit board traces, requiring no interconnect between board traces and a wire primary winding. Further, the primary windings can be constructed with very low resistance, dependent on the thickness and cross-sectional area of the conductive traces themselves, further reducing resistive loss in the main power path. Excellent magnetic coupling between primary and secondary is readily attainable, due to the potentially close spacing of the windings to the magnetic core. And because the primary windings, and in some embodiments all or part of the secondary windings, can reside within the plane of the printed circuit board itself, the resulting transformer can have a very low height profile, reducing its form factor and that of the systems and subsystems incorporating the transformer.

It is of course contemplated that modifications of, and alternatives to, these embodiments, such modifications and alternatives obtaining any or all of the advantages and benefits of this invention, will be apparent to those of ordinary skill in the art having reference to this specification and its drawings. It is contemplated that such modifications and alternatives are within the scope of the claims.

What is claimed is:

1. A transformer for use with a printed circuit board having a plurality of through-holes defined therein, said transformer comprising:
   a first winding comprising at least one conductive trace at least partially surrounding a first through-hole in the printed circuit board;
   a magnetic core element comprising a top member, a bottom member, and first and second legs extending between said top and bottom members, said first leg extending through the first through-hole and said second leg extending through a second through-hole in the printed circuit board, said top and bottom members of said magnetic core element disposed on opposite sides of the printed circuit board;
   a second winding concentric with a portion of said magnetic core element and comprising a wire winding including a plurality of turns encircling said first leg of said magnetic core, wherein at least some of the turns of said second winding are disposed within the first through-hole; and
   first and second leads connected to respective ends of said second winding.

2. The transformer of claim 1, wherein all of the turns of said second winding are disposed within the first through-hole of the printed circuit board.

3. The transformer of claim 1, further comprising:
   a bobbin comprising a base and a hollow pin element, said base disposed on one side of the printed circuit board and supporting said first and second leads, said hollow pin element extending from said base and disposed within the first through-hole, said second winding disposed on an outer surface of said pin element, and said first leg of said magnetic core element disposed within said hollow pin element.

4. The transformer of claim 1, wherein said at least one conductive trace comprises a plurality of conductive traces, each conductive trace disposed in one of a plurality of conductive layers of the printed circuit board, and at least partially surrounding the first through-hole.

5. The transformer of claim 4, wherein said conductive traces are connected in parallel with one another by edge plating extending around the first through-hole.

6. The transformer of claim 1, wherein said first winding is a primary winding of said transformer, wherein said second winding is a first secondary winding of said transformer, said transformer further comprising:
- a second secondary winding concentric with said first leg of said magnetic core element; and
- third and fourth leads connected to respective ends of said second secondary winding.

7. The transformer of claim 1, wherein said magnetic core element further comprises:
- a third leg extending into a third through-hole in the printed circuit board, the third through-hole disposed on an opposite side of the first through-hole from the second through-hole;
- wherein said top member is connected to a first end of each of said first, second, and third legs on one side of the printed circuit board;
- and wherein said bottom member is connected to a second end of each of said first, second, and third legs on another side of the printed circuit board.

8. A printed circuit board assembly comprising:
- a printed circuit board comprising at least one conductive trace, said printed circuit board having a plurality of through-holes defined therein, each through hole extending from a first side of the printed circuit board to a second side of the printed circuit board, said at least one conductive trace at least partially surrounding a first through-hole in said printed circuit board; and
- a transformer comprising:
  - a magnetic core element comprising a top member, a bottom member, and first and second legs extending between said top and bottom members, said first leg extending through the first through-hole in said printed circuit board, said second leg extending through a second through-hole in said printed circuit board;
  - a first winding comprising said at least one conductive trace;
  - a second winding concentric with a portion of said magnetic core element and comprising a wire winding including a plurality of turns encircling said first leg of said magnetic core, wherein at least some of the turns of said second winding are disposed within the first through-hole; and
  - first and second leads connected to respective ends of said second winding.

9. The printed circuit board assembly of claim 8, further comprising:
- a bobbin comprising a base and a hollow pin element, said base disposed on the first side of the printed circuit board and supporting said first and second leads, said hollow pin element extending from said base and disposed within the first through-hole, said second winding disposed on an outer surface of said hollow pin element, and said first leg of said magnetic core element disposed within said hollow pin element.

10. The printed circuit board assembly of claim 8, wherein said printed circuit board comprises a plurality of conductive layers, said at least one conductive trace comprising a plurality of conductive traces, each conductive trace disposed within one of said conductive layers of said printed circuit board and at least partially surrounding the first through-hole.

11. The printed circuit board assembly of claim 10, wherein said conductive traces are connected in parallel with one another by edge plating extending around the first through-hole.

12. A method of assembling a printed circuit board assembly, said method comprising:
- providing a printed circuit board including at least one conductive trace, the printed circuit board having a plurality of through-holes defined therein, the at least one conductive trace at least partially surrounding a first through-hole in the printed circuit board;
- providing a magnetic core element including a top member, a bottom member, a first leg, and a second leg;
- inserting the first leg of the magnetic core element through the first through-hole such that the at least one conductive trace at least partially surrounds the first leg, the at least one conductive trace forming a first winding of a transformer;
- inserting the second leg of the magnetic core element through a second through-hole in the printed circuit board; and
- coupling a second winding to the printed circuit board such that the second winding is concentric with a portion of the magnetic core element, the second winding including a wire winding, wherein coupling the second winding includes coupling the seconding winding to the printed circuit board such that the wire winding includes a plurality of turns encircling the first leg of the magnetic core and at least some of the turns are disposed within the first through-hole; and
- connecting first and second leads to respective ends of the second winding.

* * * * *